United States Patent
Kim et al.

(10) Patent No.: US 9,570,478 B2
(45) Date of Patent: Feb. 14, 2017

(54) NARROW BEZEL FLAT PANEL DISPLAY

(71) Applicant: LG Display Co., Ltd., Seoul (KR)

(72) Inventors: Minjoo Kim, Seoul (KR); Kyoungjin Nam, Gyeonggi-do (KR); Seongjoo Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/934,242

(22) Filed: Nov. 6, 2015

(65) Prior Publication Data

US 2016/0133653 A1 May 12, 2016

(30) Foreign Application Priority Data

Nov. 7, 2014 (KR) .................. 10-2014-0154649

(51) Int. Cl.
*H01L 29/10* (2006.01)
*H01L 27/12* (2006.01)
*G02F 1/1333* (2006.01)
*G02F 1/1339* (2006.01)
*G02F 1/1345* (2006.01)

(52) U.S. Cl.
CPC ......... *H01L 27/1248* (2013.01); *G02F 1/1339* (2013.01); *G02F 1/13454* (2013.01); *G02F 1/133345* (2013.01); *G02F 2001/133357* (2013.01)

(58) Field of Classification Search
CPC .............. G02F 1/133345; G02F 1/1339; G02F 1/13454
USPC ........................................... 257/66
See application file for complete search history.

(56) References Cited

U.S. PATENT DOCUMENTS

| | | | |
|---|---|---|---|
| 2005/0184927 A1* | 8/2005 | Kwak | H01L 51/5246 345/45 |
| 2013/0003006 A1* | 1/2013 | Wang | G02F 1/1339 349/138 |
| 2014/0320789 A1* | 10/2014 | Son | G02F 1/1337 349/123 |
| 2015/0102293 A1* | 4/2015 | Cho | H01L 33/56 257/40 |
| 2015/0131041 A1 | 5/2015 | Moriwaki | |

FOREIGN PATENT DOCUMENTS

WO 2013/175709 A1 11/2013

OTHER PUBLICATIONS

Extended European Search Report issued in corresponding European Patent Application No. 15193460.1 dated Dec. 10, 2015.

* cited by examiner

*Primary Examiner* — Douglas Menz
(74) *Attorney, Agent, or Firm* — Morgan, Lewis & Bockius LLP

(57) ABSTRACT

Provided is a flat panel display. A flat panel display includes: a lower panel defining a display area and a non-display area, a driver element and a line within the non-display area, a planar layer covering the lower panel, a first trench at the planar layer over the driver element and the line, a lower alignment layer on an upper surface of the planar layer and a lower surface of the first trench, the lower alignment layer exposing some upper surface of the planar layer at the first trench, and a sealant at the first trench.

8 Claims, 14 Drawing Sheets

NARROW BEZEL FLAT PANEL DISPLAY

CROSS-REFERENCE TO RELATED APPLICATION(S)

This application claims the benefit of Korean Patent Application No. 10-2014-0154649, filed on Nov. 7, 2014, the entire disclosure of which is hereby incorporated by reference herein for all purposes.

BACKGROUND

1. Technical Field

The present disclosure relates to a flat panel display with a narrow bezel structure. In particular, the present disclosure relates to a narrow bezel flat panel display in which the area for sealing material (or "sealant") is minimized by enhancing the attaching/adhering force of the sealant disposed between the upper substrate and the lower substrate.

2. Discussion of the Related Art

A liquid crystal display device (LCD) represents video data by controlling the light transitivity of the liquid crystal layer using electric fields. According to the direction of the electric field, the LCD can be classified in two major types: one is a vertical electric field type and the other is a horizontal electric field type.

For the vertical electric field type LCD, a common electrode formed on an upper substrate and a pixel electrode formed on a lower substrate face each other for forming an electric field perpendicular to the substrate face. A twisted nematic (TN) liquid crystal layer disposed between the upper substrate and the lower substrate is driven by the vertical electric field. The vertical electric field type LCD has a higher aperture ratio than the horizontal electric field type, but it has a narrower view angle of about 90 degrees.

For the horizontal electric field type LCD, a common electrode and a pixel electrode are formed on the same substrate in parallel. A liquid crystal layer disposed between an upper substrate and a lower substrate is driven in In-Plane-Switching (IPS) mode by an electric field parallel to the substrate face. The horizontal electric field type LCD has a wider view angle of over 170 degrees and a faster response speed than the vertical electric field type LCD. However, the horizontal electric field type LCD may have a lower aperture ratio and transitivity ratio of the back light because there is no electric field over the electrodes, so that the liquid crystals disposed over the electrodes are not driven.

For most liquid crystal displays, after surface joining the thin film transistor substrate having a plurality of thin film transistors disposed in a matrix manner and the color filter substrate having a plurality of color filters, the liquid crystal layer is inserted between these surface joined substrates. Each of the pixel areas defined in the thin film transistor substrate and each of the pixel areas defined in the color filter substrate are correspondingly aligned to each other, as these two substrates are joined. In order to reduce the aligning margin in the joining process, in some cases, the color filters may be formed on the thin film transistor substrate.

FIG. 1 is a plane view illustrating the structure of a flat panel liquid crystal display according to related art. FIG. 2 is a cross-sectional view illustrating the structure of the liquid crystal display of FIG. 1 by cutting along the line I-I' according to the related art.

With reference to FIGS. 1 and 2, the horizontal electric field type liquid crystal display in which the color filters are formed on the thin film transistor substrate includes a lower panel LP on which are disposed a plurality of pixel areas, each having one thin film transistor and one color filter in a matrix manner, an upper panel UP on which a plurality of black column spacers are disposed between the pixel areas, and a liquid crystal layer LC inserted between the lower panel LP and the upper panel UP.

The lower panel includes a lower substrate SL made of a transparent material such as the glasses. The lower substrate SL has a display area AA occupying at least most of the middle portions for representing the video data, and a non-display area NA surrounding the display area AA. The non-display area may also be referred to as the bezel area BZ. In the display area AA, a plurality of the pixel areas are disposed in a matrix manner. A thin film transistor T, a pixel electrode PXL connected to the thin film transistor T, and a color filter CF representing color are allocated in each pixel area.

In detail, the thin film transistor T is disposed at one corner of the pixel area defined in a matrix manner on the lower substrate SL. A first passivation layer PAS is deposited on the thin film transistor T for protecting it. On the first passivation layer PAS, the color filter CF is formed to cover at least most of the pixel area. For example, a red color filter CFR, a green color filter CFG, and a blue color filter CFB may be alternatively disposed on three pixel areas disposed in a serial manner. FIG. 2 shows the red and green color filters as examples with the (R) and (G) labels indicated.

A second passivation layer PAC is deposited on the color filter CF. The pixel electrode PXL connecting to the thin film transistor T is formed within the pixel area on the second passivation layer PAC. For the horizontal electric field type liquid crystal display, the pixel electrode PXL has a comb structure with a plurality of segments arrayed in parallel. Further, a common electrode COM formed as having a plurality of segments is disposed in parallel with the segments of the pixel electrode PXL one-by-one.

In addition, the upper panel UP includes an upper substrate SU made of a transparent material, such as glass. The display area AA and the non-display area NA are defined on one surface of the upper substrate SU, similarly to the lower substrate SL. A black column spacer BCS is formed on the whole area of the non-display area NA. Further, the black column spacers BCS may be disposed in the display area AA at the area corresponding to the border area between the pixel areas defined on the lower substrate SL. Usually, the black column spacers BCS are disposed between the color filters CF.

A gate driver element GIP may be formed in the non-display area NA of the lower panel LP for driving the display element formed in the display area AA. Furthermore, a ground line LIN may be disposed at the outside of the gate driver element GIP. The gate driver element GIP has a plurality of thin film transistors. For protecting these thin film transistors of the gate driver element GIP, the black column spacer BCS is usually formed to cover the whole area of the non-display area NA of the upper panel UP.

After that, with the liquid crystal layer LC, the surface of the upper panel UP on which the black column spacers BCS are disposed, and the surface of the lower panel on which the display elements are disposed are joined as facing each other so that the liquid crystal display is completed. The column spacer CS maintains an even cell gap between the upper substrate SU and the lower substrate SL. Further, the column spacer CS may provide the black matrix function between the color filters CF, as shown in FIG. 2.

In the case that the color filter CF is formed on the lower substrate SL with the thin film transistor T as mentioned above, the color filter CF is formed within the pixel areas defined on the lower substrate SL, such that the color filter CF can be just aligned with the pixel area. Further, on the upper panel UP, as only the black column spacer BCS and/or the column spacer CS are formed, the manufacturing process for the upper panel UP may be simplified.

For example, in order to join the upper panel UP and the lower panel LP, a sealing material SEAL may be disposed along the circumference along the non-display area NA of the lower panel LP. Further, the liquid crystal layer LC may be disposed within the display area AA of the lower panel LP. After that, the upper panel UP is aligned over the lower panel LP, and then is attached to the lower panel LP. The upper panel UP and the lower panel LP can be bonded to each other by the sealing material SEAL by applying an attaching force, thermal energy, and/or light energy.

For the liquid crystal display, the alignment layers are disposed on each inner upper layer of the lower panel LP and the upper panel UP. A lower alignment layer LPI is disposed on the uppermost layer of the lower panel LP. An upper alignment layer UPI is disposed on the uppermost layer of the upper panel UP. The sealing material SEAL is inserted between the lower alignment layer LPI and the upper alignment layer UPI for adhering the lower panel LP and the upper panel UP.

In the case that the bezel area BZ is minimized, the area for disposing the sealing material SEAL is minimized so that the sealing material SEAL should be disposed on the alignment layers LPI and UPI. As the sealing material SEAL has a low adhesive property with respect to the alignment layers LPI and UPI, it may cause breaking at the attached portions of the liquid crystal display. In the cases that the bezel area is relatively wide, the sealing material SEAL can be disposed as being apart from the alignment layers LPI and UPI. However, for the narrow bezel structure, the sealing material SEAL should be disposed on the alignment layers LPI and UPI. Therefore, there is a desire to develop a liquid crystal display having a structure for enhancing the adhesiveness between the sealing material and the alignment layer.

SUMMARY

Accordingly, the present disclosure is directed to a narrow bezel flat panel display that substantially obviates one or more of the problems due to limitations and disadvantages of the related art.

An object of the present disclosure is to provide a flat panel display having a narrow bezel structure. Another objective of the present disclosure is to provide a narrow bezel structure flat panel display in which the adhesive property is enhanced between the sealing material and the alignment layer even though the sealing material overlaps with the area for alignment layers. Yet another objective of the present disclosure is to provide an alignment layer that may not selectively cover where the sealing material is disposed. Still another objective of the present disclosure is to provide a narrow bezel structure flat panel display in which the adhesive property is enhanced between the sealing material and the alignment layer by forming a trench at the passivation layer where the sealing material is disposed.

Additional features and advantages will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a flat panel display, including: a lower panel defining a display area and a non-display area, a driver element and a line within the non-display area, a planar layer covering the lower panel, a first trench at the planar layer over the driver element and the line, a lower alignment layer on an upper surface of the planar layer and a lower surface of the first trench, the lower alignment layer exposing a portion of the upper surface of the planar layer at the first trench, and a sealant at the first trench.

In another aspect, there is provided a flat panel display, including: a lower panel defining a display area and a non-display area, a driver element and a line within the non-display area, a planar layer covering the lower panel, a trench at the planar layer over the driver element and the line, a passivation layer on an upper surface of the planar layer and the side wall of the trench, a lower alignment layer on an upper surface of the passivation layer and on a lower surface of the trench, the lower alignment layer exposing a portion of the upper surface of the passivation layer at the trench, and a sealant at the first trench.

In another aspect, there is provided a flat panel display, including: a panel, a thin film transistor and a line on the panel, an insulating layer covering the thin film transistor and the line, an alignment layer covering the insulating layer, a ridge and a furrow at the insulating layer on the line, the ridge and the furrow preventing the alignment layer from remaining on the ridge, and a sealant on the alignment layer contacting the insulating layer at the ridge and the furrow.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the invention.

Figure 1:
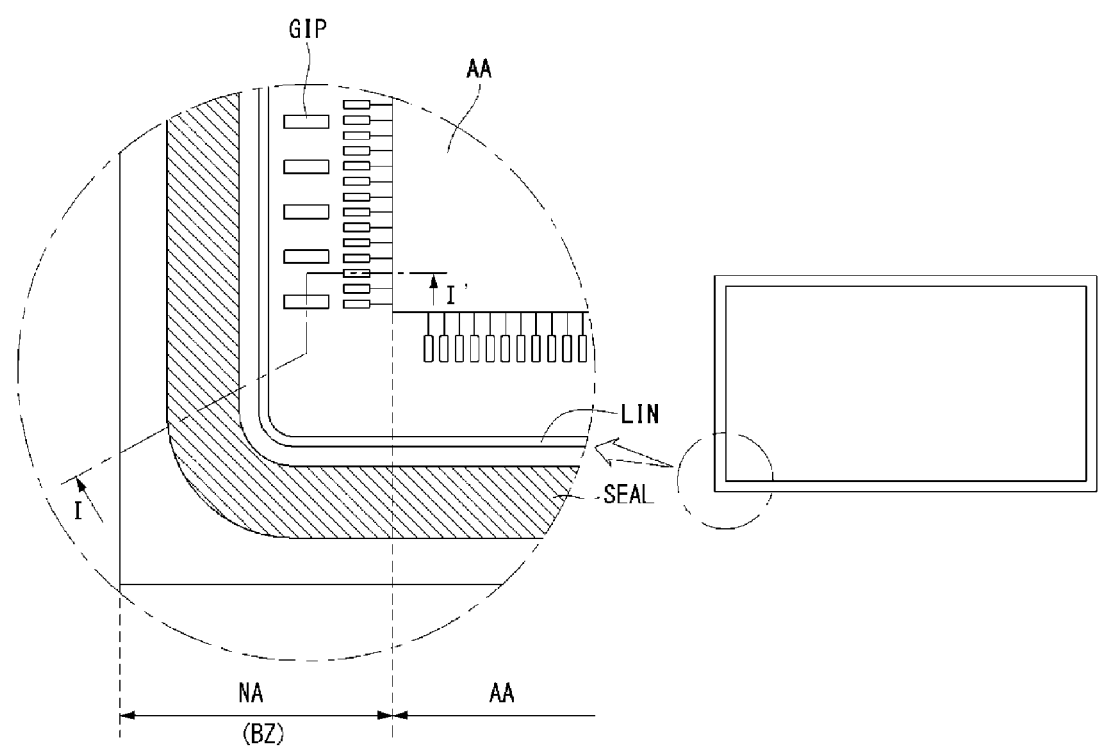
FIG. 1 is a plane view illustrating the structure of a flat panel liquid crystal display according to related art.
Figure 2:
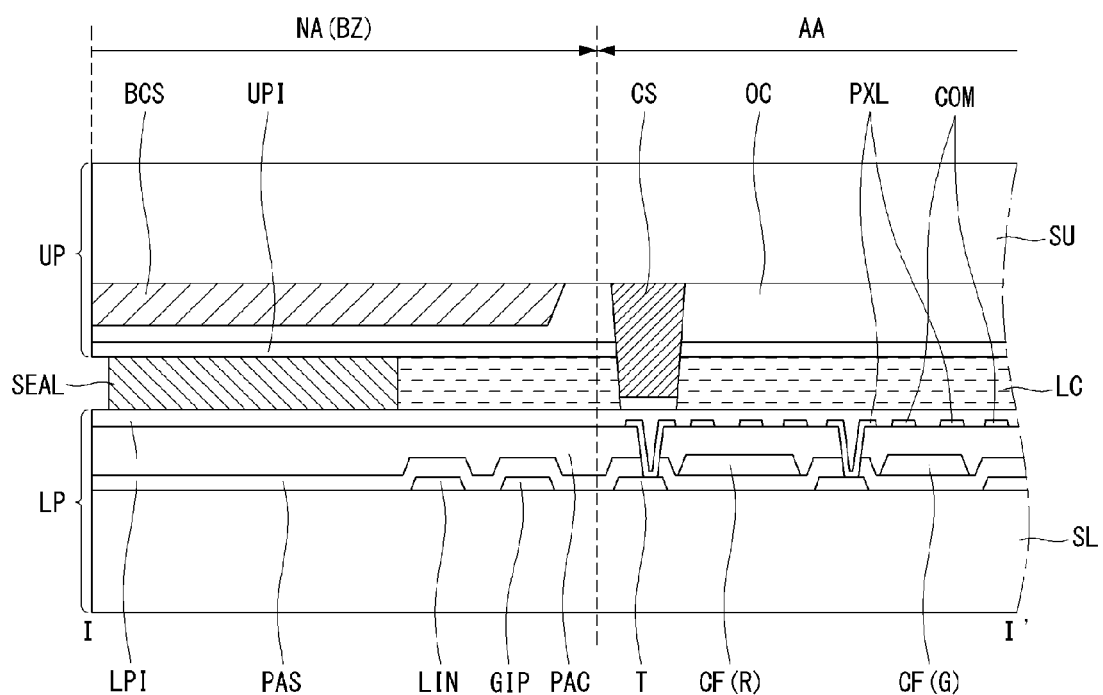
FIG. 2 is a cross-sectional view illustrating the structure of the liquid crystal display of FIG. 1 by cutting along the line I-I' according to the related art.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present invention, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

First Embodiment

Figure 3:
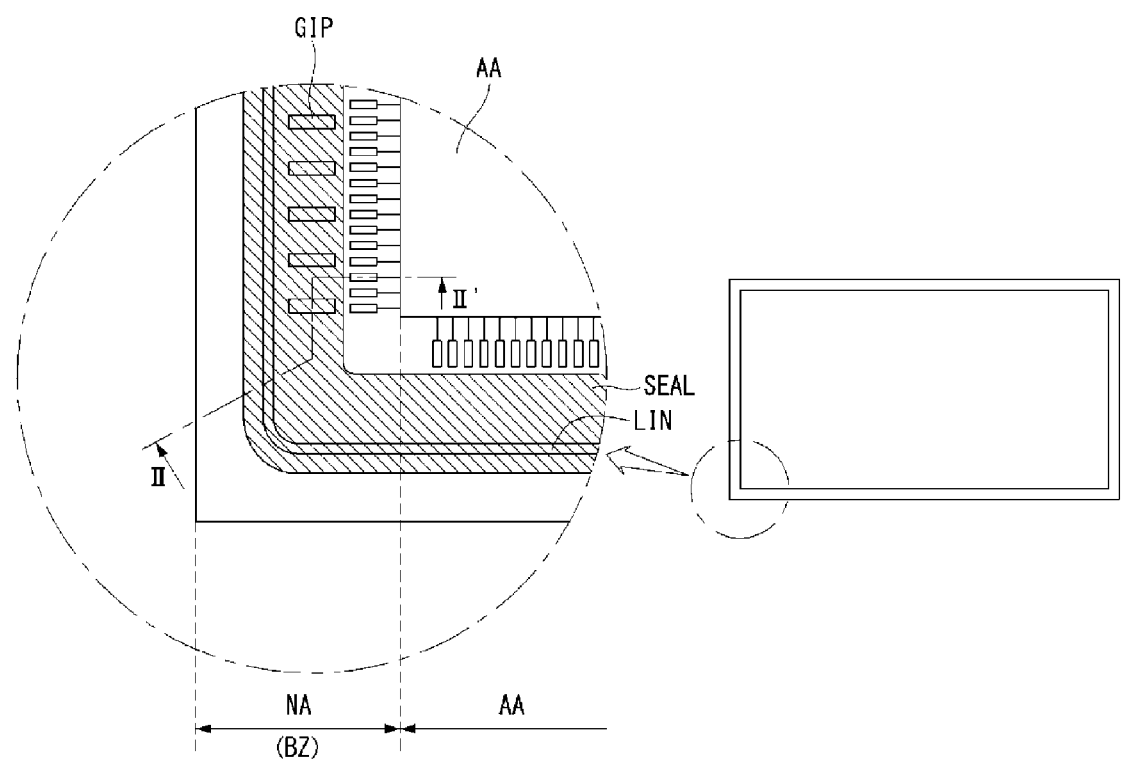
FIG. 3 is a plane view illustrating a structure of a flat panel liquid crystal display according to the present disclosure.
Figure 4:
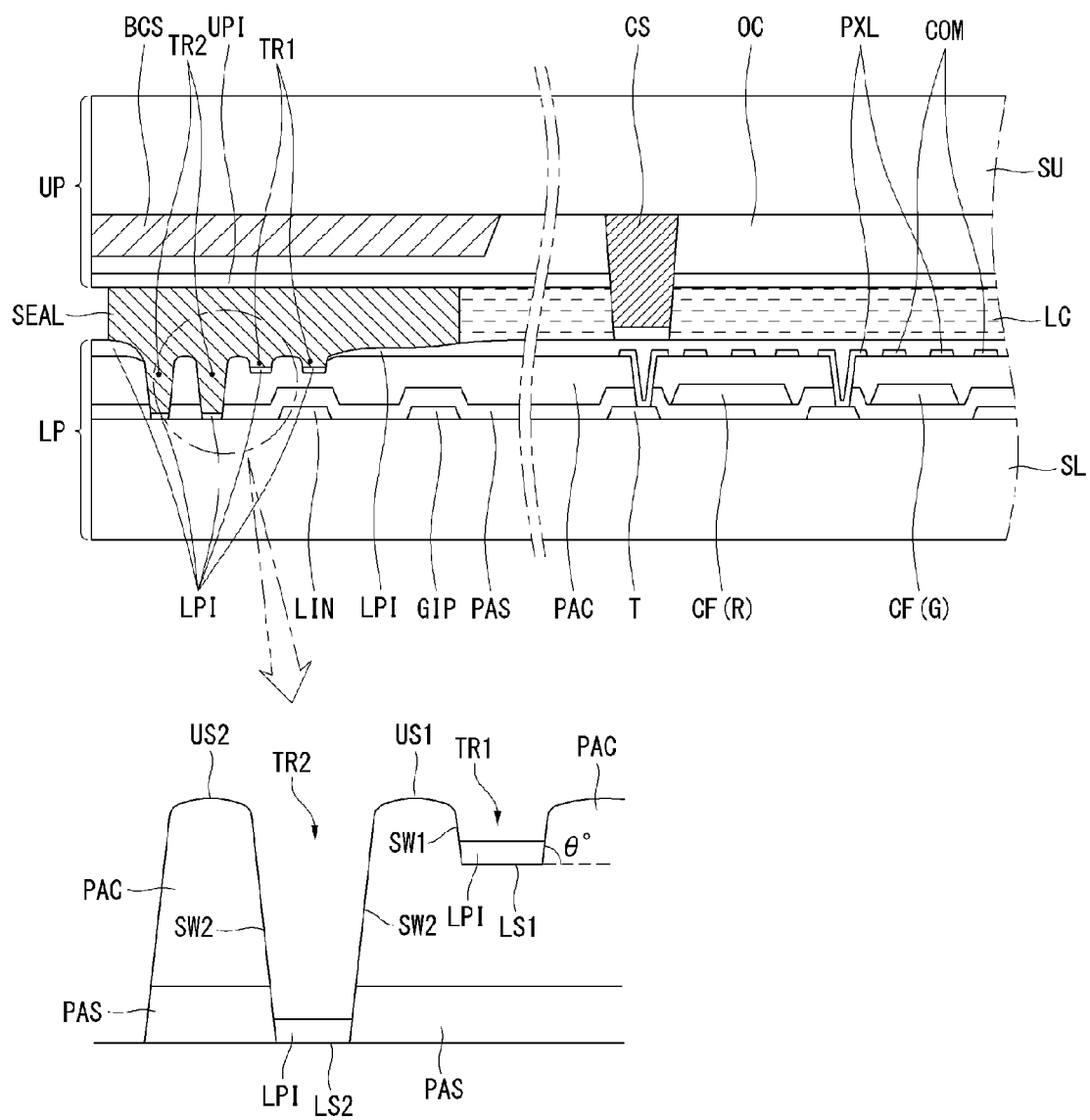
FIG. 4 is a cross-sectional view illustrating a structure of the in-plane switching type flat panel liquid crystal display by cutting along the line II-II' in FIG. 3 according to the present disclosure.

A first embodiment of the present disclosure will be explained with reference to FIGS. 3 and 4. FIG. 3 is a plane view illustrating a structure of a flat panel liquid crystal display according to the present disclosure. FIG. 4 is a cross-sectional view illustrating a structure of the in-plane switching type flat panel liquid crystal display by cutting along the line II-II' in FIG. 3 according to the present disclosure.

For an in-plane switching (IPS) type liquid crystal display, an example of which being a flat panel display according to the first embodiment of the present disclosure, many elements may be very similar to those of the related art. The IPS-type liquid crystal display has a pixel electrode and a common electrode disposed on the same level layer and arrayed in a parallel manner at a predetermined distance from one another. One of the main features of the first embodiment is the narrow bezel structure in which the force for attaching the lower panel and the upper panel is enhanced. For example, in the plane view, a feature of the liquid crystal display according to the first embodiment is that the sealant SEAL overlaps the gate driver element GIP and the ground line LIN, as shown in FIG. 3, so that the bezel area BZ is minimized.

In detail, as shown in FIGS. 3-4, the in-plane switching type liquid crystal display according to the first embodiment of the present disclosure may include a lower panel LP including a plurality of pixel areas, disposed in a matrix manner and having a thin film transistor T and a color filter CF, an upper panel UP having a column spacer CS which may be made of black resin material and disposed between the pixel areas, and a liquid crystal layer LC inserted between the lower panel LP and the upper panel UP.

The lower panel LP may include a lower substrate SL made of a transparent material, such as glass, and display elements formed on the lower substrate SL. The lower substrate SL may have a display area AA occupying the middle portions of the lower substrate SL for representing the video data, and a non-display area NA surrounding the display area AA. The non-display area may also be referred to as the bezel area BZ. In the display area AA, a plurality of pixel areas are defined in a matrix manner. In each pixel area, a thin film transistor T, a pixel electrode PXL connected to the thin film transistor T, and a color filter CF for representing color may be allocated.

The thin film transistor T may be formed at one corner of the pixel area defined on the lower substrate SL. A passivation layer PAS may be deposited on the thin film transistor T for protecting the thin film transistor T. The color filter CF may be formed as covering at least most of the pixel area on the passivation layer PAS. For example, a red color filter CFR, a green color filter CFG and a blue color filter CFB may be alternatively disposed on three pixel areas disposed in a serial manner. FIG. 3 shows the red and green color filters as examples with the (R) and (G) labels indicated.

A planar layer PAC may be deposited on the color filter CF. The pixel electrode PXL connecting to the thin film transistor T may be formed within the pixel area on the planar layer PAC. For the horizontal electric field type liquid crystal display, the pixel electrode PXL has a comb structure in which a plurality of segments is arrayed in parallel. Further, a common electrode COM formed as having a plurality of segments is disposed in parallel with the segments of the pixel electrode PXL, one-by-one. Furthermore, a lower alignment layer LPI may be disposed at the uppermost layer of the lower panel LP to cover the whole surface of the lower substrate SL.

In addition, the upper panel UP may include an upper substrate SU made of a transparent material, such as glass. The display area AA and the non-display area NA are defined on one surface of the upper substrate SU, similarly to the lower substrate SL. A black column spacer BCS may be formed on the whole area of the non-display area NA. Further, in the display area AA, the column spacers CS may be disposed at the area corresponding to the border area between the pixel areas defined on the lower substrate SL. In one embodiment, the column spacers CS may be disposed between the color filters CF. The black column spacer BCS disposed in the non-display area NA and the column spacer CS disposed in the display area AA may be made of the same material, such as a black resin.

A gate driver element GIP may be formed in the non-display area NA of the lower panel LP for driving the display element formed in the display area AA. Furthermore, a ground line LIN may be disposed at the outside of the gate driver element GIP. The gate driver element GIP may have a plurality of thin film transistors. These thin film transistors may be very sensitive to light incident from outside, e.g., ambient light. For protecting these thin film transistors of the gate driver element GIP from the light, embodiments may include the black column spacer BCS covering the whole area of the non-display area NA of the upper panel UP.

After that, the surface of the upper panel UP on which the column spacers CS are disposed and the surface of the lower panel on which the display elements are disposed are joined to face each other, with the liquid crystal layer LC so that the liquid crystal display is completed. The column spacer CS may maintain an even cell gap between the upper substrate SU and the lower substrate SL. Further, the column spacer CS may provide the black matrix function between the color filters CF, as shown in FIG. 4. In addition, an upper alignment layer UPI may be disposed at the uppermost layer of the upper panel UP to cover the whole surface of the upper substrate SU.

Using the sealant SEAL disposed at the non-display area NA, the upper panel UP and the lower panel LP may be attached and/or joined to each other. To provide the narrow bezel structure, the sealant SEAL overlaps the gate driver element GIP and the ground line LIN. As the result, the bezel area BZ can be minimized.

In the case that the sealant SEAL is disposed on the lower and upper alignment layers LPI and UPI, the attaching force between the sealant SEAL and the alignment layers LPI and UPI may be disposed remarkably lower than the attaching force between the sealant SEAL and the other layer, e.g., the planar layer PAC. This can cause a problem for attaching or joining the upper panel UP and the lower panel LP.

Figure 5:
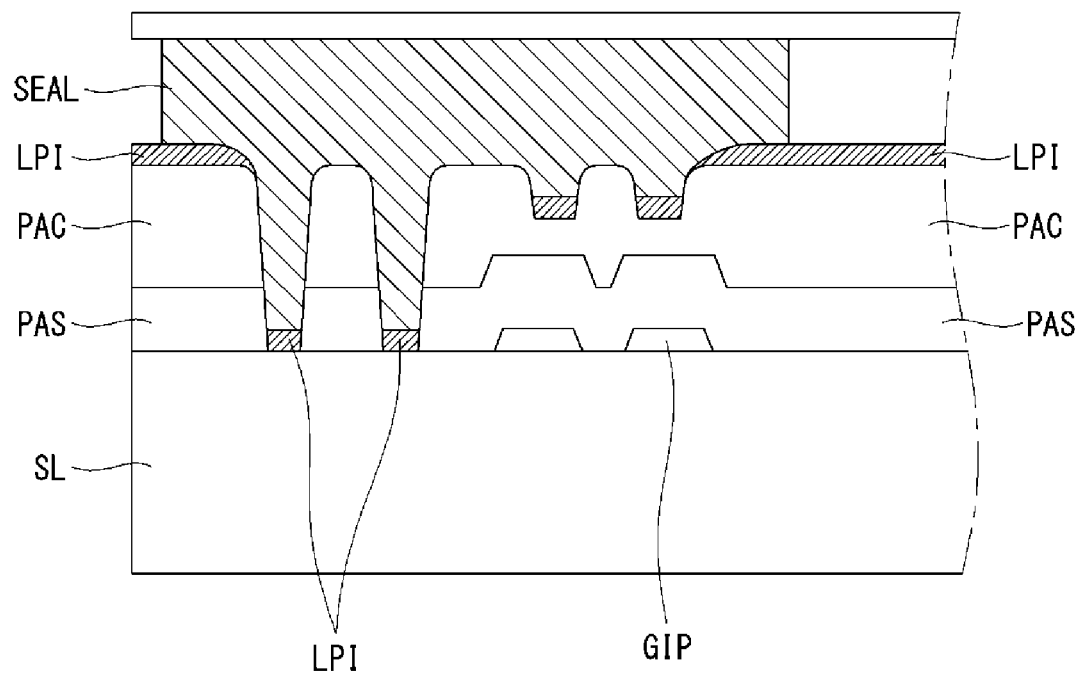
FIG. 5 is an enlarged cross-sectional view illustrating an attaching structure where the sealant is disposed in FIG. 4.

To solve this problem, embodiments of the present disclosure may include a liquid crystal display having a structure in which the lower alignment layer LPI is partially or selectively not disposed on some area of the lower panel LP where the sealant SEAL is disposed. Hereinafter, the portions at which the sealant is disposed in the lower substrate of the IPS type liquid crystal display according to the first embodiment of the present disclosure will be explained with reference to FIGS. 4-5. FIG. 5 is an enlarged cross-sectional view illustrating an attaching structure where the sealant is disposed in FIG. 4.

At some portions of the planar layer PAC over the gate driver element GIP and the ground line LIN, a first trench TR1 (FIG. 4) may be formed by etching some thickness of the planar layer PAC.

The first trench TR1 has a predetermined depth. The first trench TR1 may include a first upper surface US1, a first lower surface LS1, and a first side wall SW1 connected to and linking the first upper surface US1 and the first lower surface LS1. In forming the lower alignment layer LPI on the planar layer PAC having the first trench TR1, the lower alignment layer LPI is not disposed on the first upper surface US1 of the first trench TR1. Instead, the lower alignment layer LPI is disposed only on the first lower surface LS1 of the first trench TR1.

In order to not selectively dispose the lower alignment layer LPI on the first upper surface US1, embodiments may include that the taper angle (θ°) of the first trench TR1 is at least 50 degrees. That is, the slant angle between the first lower surface LS1 and the first side wall SW1 is at least 50 degrees. Embodiments may include that the taper angle is larger than 55 degrees. Further, the first upper surface US1 may have a convex profile, such that the height is slightly lowered from the middle portion to the side portion. With these structures, in forming the lower alignment layer LPI on the lower substrate SL, the lower alignment layer LPI may not remain on the first upper surface US1 of the first trench TR1. Most or all of the alignment layer LPI may flow into the first trench TR1.

In addition, on the planar layer PAC disposed on the circumferential area surrounding the gate driver element GIP and the ground line LIN, a second trench TR2 may be formed. The second trench TR2 may be formed to expose the upper surface of the lower substrate SL. For example, the second trench TR2 may include a second upper surface US2 of the planar layer PAC, a second lower surface LS2 (which is the exposed surface of the lower substrate SL), and a second side wall SW2 connected to and linking the second upper surface US2 and the lower substrate SL. As the second trench TR2 may be formed by patterning the planar layer PAC and the passivation layer PAS until exposing the upper surface of the lower substrate SL, the taper angle of the second trench TR2 is larger than the taper angle (θ°) of the first trench TR1. Further, the second upper surface US2 may also have the convex profile, such that the height is slightly lowered from the middle portion to the side portion. With these structures, in forming the lower alignment layer LPI on the lower substrate SL, the lower alignment layer LPI may not remain on the second upper surface US2 of the second trench TR2. Most or all of the alignment layer LPI may flow into the second trench TR2.

Consequently, on some portions of the planar layer PAC where the first trench TR1 and the second trench TR2 are formed, the lower alignment layer LPI may not be disposed and these portions of planar layer PAC may be exposed. As shown in FIG. 5, by disposing the sealant SEAL within these structures, the sealant SEAL may directly contact with some upper surfaces of the planar layer PAC, especially where the trenches are formed. In addition, as the sealant SEAL fills into the inner spaces of the trenches, the sealant SEAL may directly contact with the side walls of the trenches TR1, TR2. Therefore, the narrow bezel structure according to the present disclosure can provide greater attaching and/or joining forces between the upper panel UP and the lower panel LP than the related art.

Figure 6A:
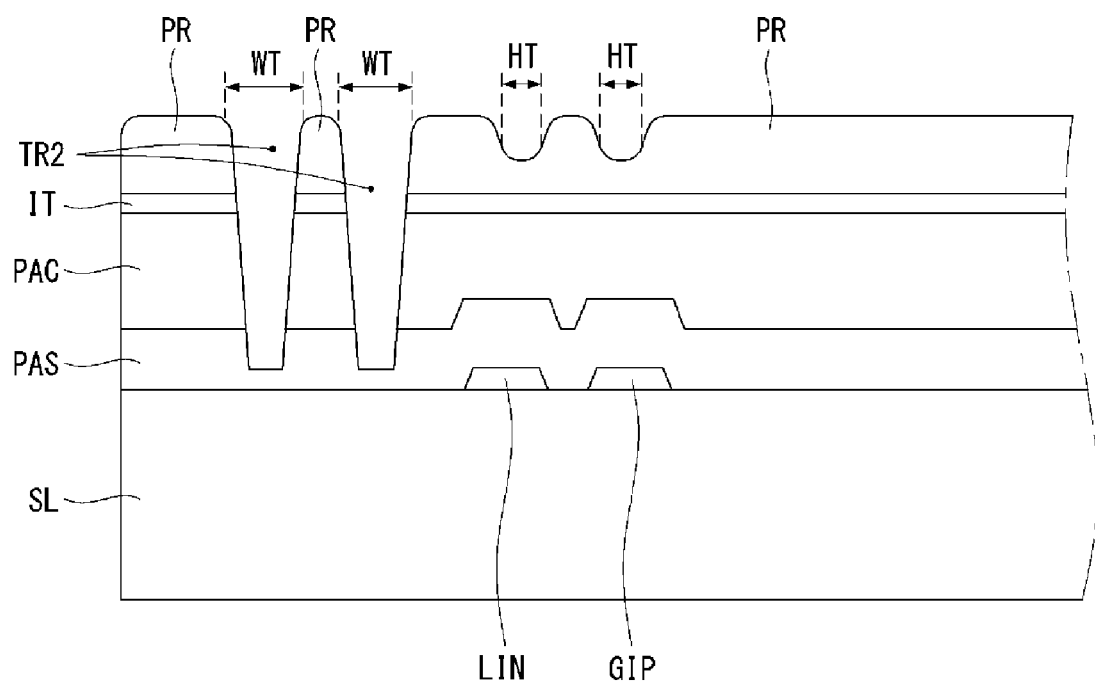
FIGS. 6A to 6C are cross-sectional views illustrating a method for manufacturing the thin film transistor substrate for an in-plane switching type liquid crystal display according to the present disclosure.
Figure 6B:
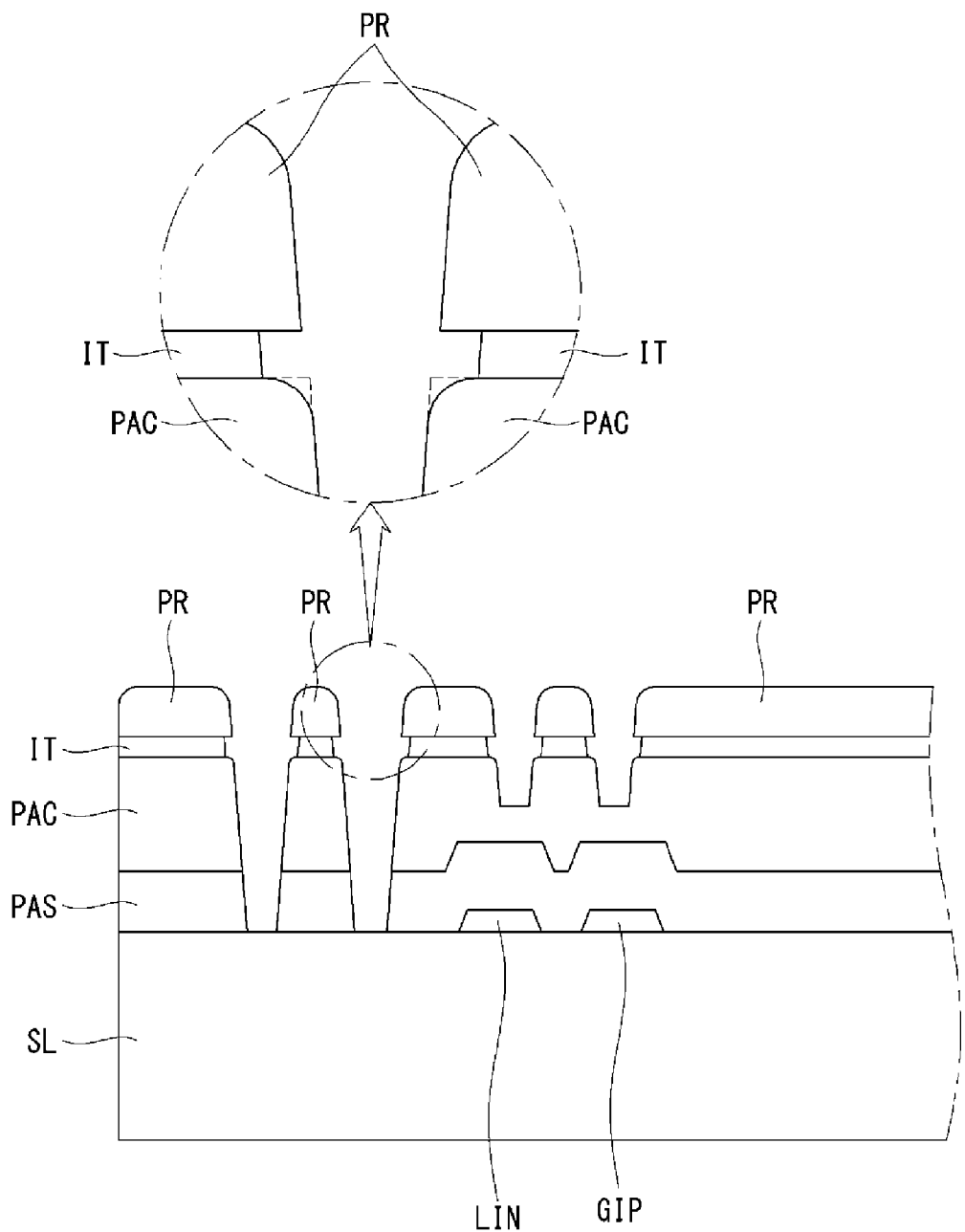
Figure 6C:
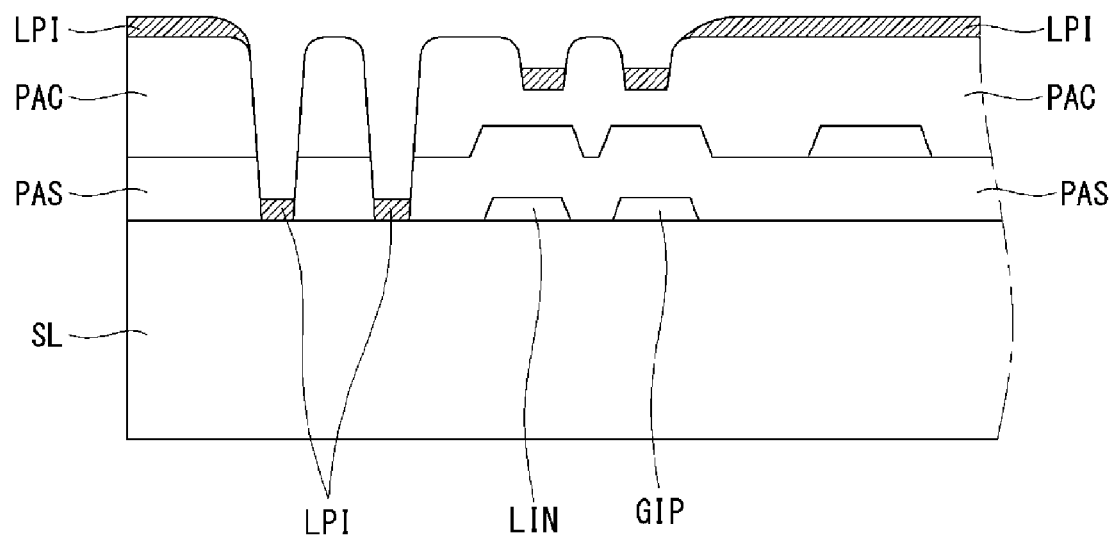

Hereinafter, the method for manufacturing the thin film transistor substrate for the liquid crystal display according to the first embodiment of the present disclosure will be explained with reference to FIGS. 6A to 6C. FIGS. 6A to 6C are cross-sectional views illustrating a method for manufacturing the thin film transistor substrate for an in-plane switching type liquid crystal display according to the present disclosure.

As shown in FIG. 6A, a lower substrate SL for the thin film transistor substrate is prepared. The thin film transistor T may be formed on the lower substrate SL, and the passivation layer PAS may be deposited to cover the thin film transistor T. The color filter CF may be formed within the pixel area on the passivation layer PAS. The planar layer PAC may be disposed on the lower substrate SL having the color filter CF to cover the whole surface of the lower substrate SL. The drain electrode of the thin film transistor T may be exposed, forming the pixel contact hole at the planar layer PAC. The transparent conductive layer IT may be deposited on the planar layer PAC. The photoresist PR may be coated on the transparent conductive layer IT. Using the exposure process and development process, the photoresist PR may be patterned to have the same shape of the pixel electrode PXL and the common electrode COM. Embodiments may use the half-tone mask for patterning the photoresist PR. For example, the half-tone area HT may be defined on the area where the first trench TR1 is formed, and the open area (or "white-tone area") WT may be defined on the area where the second trench TR2 is formed. At first, some depth of the second trench TR2 may be patterned at the open area WT. That is, the second trench TR2 may not be fully patterned but may be partially patterned having a predetermined depth. After that, the patterning for etching the remaining depth for the second trench TR2 may be conducted along with patterning the first trench TR1.

The photoresist PR may be thinned using an ashing process. For example, the ashing process may be performed until the photoresist PR on the half-tone area is removed. After that, using the remaining photoresist PR as the mask, the first trench TR1 may be formed by etching the transparent conductive layer IT and the planar layer PAC exposed by the photoresist PR. At the same time, the remaining depth of the second trench TR2 may be etched to expose the upper surface of the lower substrate SL. For example, embodiments may include that the dry etching process is applied. Using the dry etching process, it is possible to ensure that the taper angle of the first trench TR1 is at least 50 degrees. During the etching process, the side portions of the planar layer PAC between the trenches may be more etched than the middle portions, so that the upper surface of the trench has the convex profile, such that the height is slightly lowered from the middle portion to the side portion, as shown in FIG. 6B.

All of the remaining photoresist PR may be removed. Using a further mask process, the transparent conductive layer IT may be patterned to form the pixel electrode PXL and the common electrode COM. By this mask process, the transparent conductive layer IT on the non-display area may be removed. After that, the lower alignment layer LPI may be disposed on the whole surface of the lower substrate SL having the first trench TR1 and the second trench TR2. Then, the lower alignment layer LPI may be disposed on the uppermost surface of the planar layer PAC. However, the lower alignment layer LPI may not be disposed on the upper surface of the planar layer PAC where the first trench TR1 and the second trench TR2 are located. Instead, the lower alignment layer LPI may flow into the inner space of the first trench TR1 and the second trench TR2, as shown in FIG. 6C.

As the lower alignment layer LPI may not be disposed on the area in which the trenches TR1 and TR2 are formed, the sealant SEAL may directly contact the planar layer PAC. Therefore, it is possible to ensure sufficient attaching or joining force of the sealant SEAL. After disposing the sealant SEAL on the surface of the non-display area NA where the first trench TR1 and the second trench TR2 are formed, and disposing the liquid crystal layer LC within the display area AA, the upper panel UP may be attached on the lower panel LP. As such, the liquid crystal display may be complete.

Second Embodiment

In the first embodiment above, a structure for enhancing the joining and/or attaching force in the in-plane switching type liquid crystal display was explained. Hereinafter, a structure for enhancing the joining/attaching force in the fringe field switching (FFS) type liquid crystal display will be explained. For the FFS type, as the common electrode and the pixel electrode are disposed in different level layers, the cross-sectional structure is more complicated than that of the IPS type.

In the second embodiment, the detailed structure applied with the spirit of the present disclosure to the FFS type liquid crystal display will be explained. One feature of the FFS type is that the pixel electrode and the common electrode are disposed in different level layers, and they overlap each other with an insulating layer. One of the pixel or common electrodes has the surface type electrode and the other one has a plurality of segments parallel to each other with a predetermined distance. As the general FFS type liquid crystal display according to the second embodiment of the present disclosure has similarities to the related art, description of similar features may be omitted.

Figure 7:
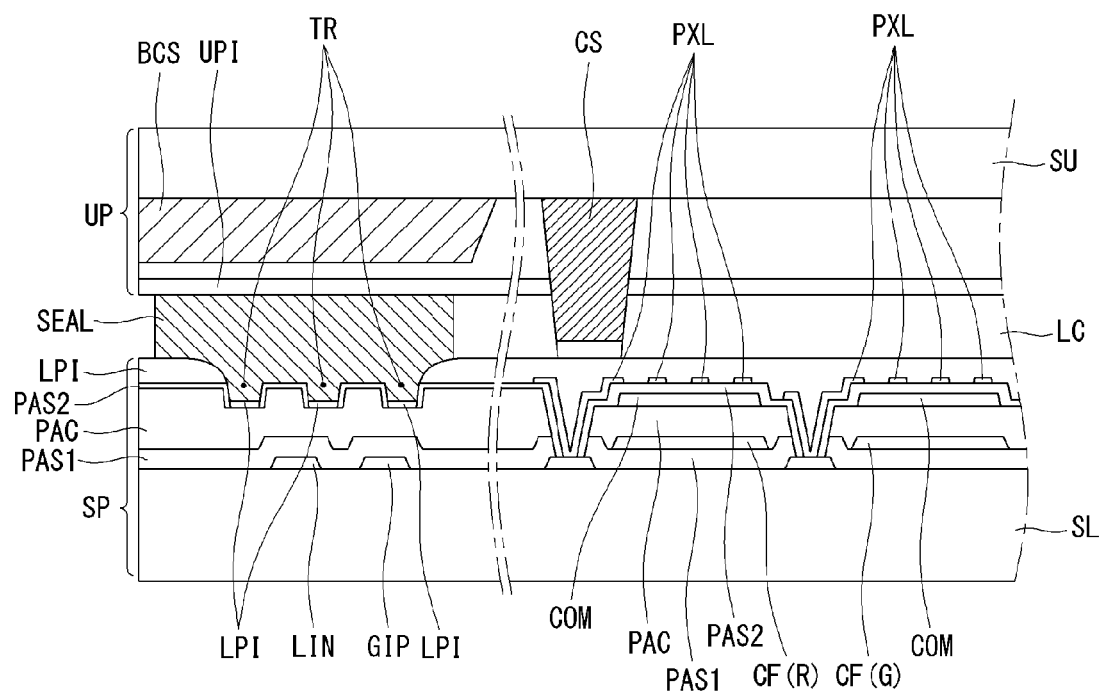
FIG. 7 is a cross-sectional view illustrating a structure of a fringe field switching type liquid crystal display, one of flat panel display, by cutting along the line II-II' in FIG. 3 according to the present disclosure.

Further, as one of the features in the second embodiment is at the non-display area NA, there will also be reference to FIG. 3, which is an example of the first embodiment. FIG. 7 is a cross-sectional view illustrating a structure of a fringe field switching type flat panel liquid crystal display by cutting along the line II-II' in FIG. 3 according to the present disclosure.

The fringe field switching type liquid crystal display according to the second embodiment of the present disclosure may include a lower panel LP including a plurality of pixel areas disposed in a matrix manner and having a thin film transistor T and a color filter CF, an upper panel UP having a column spacer CS disposed between the pixel areas, and a liquid crystal layer LC between the lower panel LP and the upper panel UP.

The lower panel LP may include a lower substrate SL made of a transparent material, such as glass, and display elements formed on the lower substrate SL. The lower substrate SL has a display area AA occupying the middle portions of the lower substrate SL for representing the video data, and a non-display area NA surrounding the display area AA. In the display area AA, a plurality of pixel areas are defined in a matrix manner. In each pixel area, a thin film transistor T, a pixel electrode PXL connected to the thin film transistor T, and a color filter CF for representing color are allocated.

The thin film transistor T may be formed at one corner of the pixel area defined on the lower substrate SL. A first passivation layer PAS1 may be deposited on the thin film transistor T for protecting the thin film transistor T. The color filter CF may cover at least most of the pixel area on the first passivation layer PAS1. For example, a red color filter CFR, a green color filter CFG and a blue color filter CFB may be alternatively disposed on three pixel areas in a serial manner.

A planar layer PAC is deposited on the color filter CF. The common electrode COM having a size and a shape corresponding to those of the color filter CF may be formed within the pixel area on the planar layer PAC. All common electrodes COM disposed in each pixel area may be connected to each other by the common line. Otherwise, the common electrode COM may have a shape covering the whole upper surface of the planar layer PAC, except for some portions, such as the contact holes.

A second passivation layer PAS2 may be deposited on the whole surface of the lower substrate SL having the common electrode COM. The pixel electrode PXL connecting to the thin film transistor T may be formed on the second passivation layer PAS2. For the FFS type liquid crystal display, the pixel electrode PXL has a comb structure with a plurality of segments arrayed in parallel. Further, the segments of the pixel electrode PXL overlap with the common electrode COM on the second passivation layer PAS2. Further, a lower alignment layer LPI may be disposed at the uppermost layer of the lower panel LP to cover the whole surface of the lower substrate SL.

In addition, the upper panel UP may include an upper substrate SU made of a transparent material, such as glass. The display area AA and the non-display area NA on one surface of the upper substrate SU may be defined like the lower substrate SL. A black column spacer BCS may be formed on the whole area of the non-display area NA. Further, the column spacers CS may be disposed in the display area AA at the area corresponding to the border area between the pixel areas defined on the lower substrate SL. Embodiments may include that the column spacers CS are disposed between the color filters CF. The black column spacer BCS disposed in the non-display area NA and the column spacer CS disposed in the display area AA may be made of the same material, such as a black resin material.

In the non-display area NA of the lower panel LP, a gate driver element GIP may be formed for driving the display element formed in the display area AA. Further, a ground line LIN may be disposed at the outside of the gate driver element GIP. The gate driver element GIP may have a plurality of thin film transistors. These thin film transistors may be very sensitive to light incident from outside, e.g., ambient light. For protecting these thin film transistors of the gate driver element GIP from the light, the black column spacer BCS can be formed to cover the whole area of the non-display area NA of the upper panel UP. Further, an upper alignment layer UPI may be disposed at the uppermost layer of the upper panel UP to cover the whole surface of the upper substrate SU.

After that, the surface of the upper panel UP on which the column spacers CS are disposed and the surface of the lower panel on which the display elements are disposed may be joined to face each other, with the liquid crystal layer LC, so that the liquid crystal display may be completed. The column spacer CS may maintain an even cell gap between the upper substrate SU and the lower substrate SL. Further, the column spacer CS may provide the black matrix function between the color filters CF.

Using the sealant SEAL disposed at the non-display area NA, the upper panel UP and the lower panel LP may be attached and/or joined to each other. For example, in order to provide the narrow bezel structure, the sealant SEAL may overlap the gate driver element GIP and the ground line LIN. As the result, the bezel area BZ can be minimized.

In the case that the sealant SEAL is disposed on the lower and upper alignment layers LPI and UPI, the attaching force between the sealant SEAL and the alignment layers LPI and UPI may be remarkably lower than the attaching force between the sealant SEAL and the other layer, e.g., the planar layer PAC. This can cause a problem for attaching and/or joining the upper panel UP and the lower panel LP.

Figure 8:
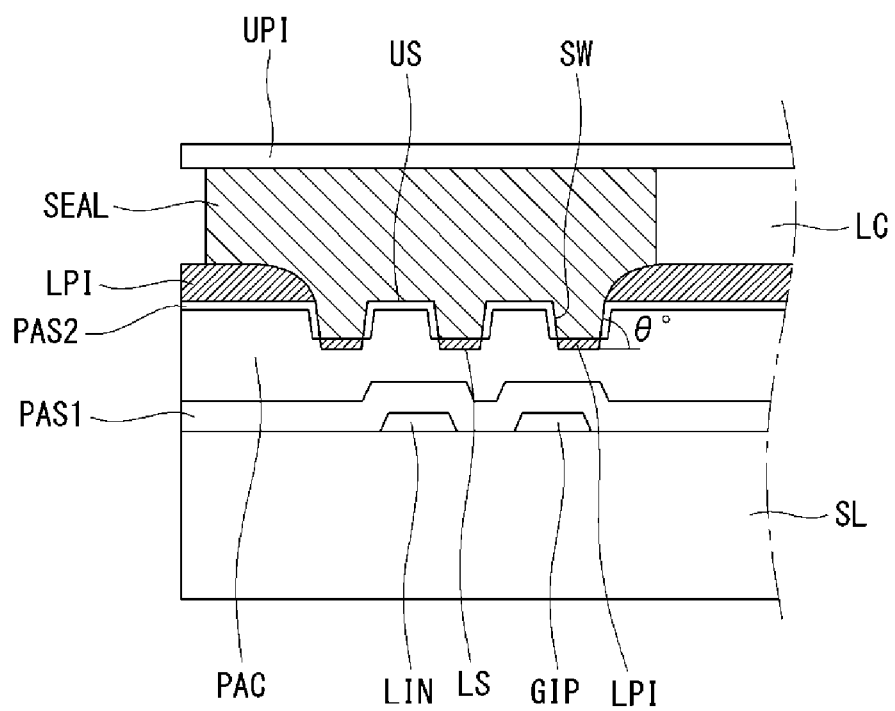
FIG. 8 is an enlarged cross-sectional view illustrating an attaching structure where the sealant is disposed in FIG. 7.

To solve this problem, the present disclosure provides a liquid crystal display having a structure in which the lower alignment layer LPI is partially or selectively not disposed on some area of the lower panel LP where the sealant SEAL is disposed. Hereinafter, with reference to FIGS. 7-8, the portions at which the sealant is disposed in the lower substrate of the FFS type liquid crystal display according to the second embodiment of the present disclosure will be explained. FIG. 8 is an enlarged cross-sectional view illustrating an attaching structure where the sealant is disposed in FIG. 7.

At the some portions of the second passivation layer PAS2 and the planar layer PAC over the gate driver element GIP and the ground line LIN, a trench TR may be formed by etching the second passivation layer PAS2 and some thickness of the planar layer PAC. For example, in the second embodiment, the trench TR may be formed to penetrate the second passivation layer PAS2 and to sink into the planar layer PAC with a predetermined depth. For convenience, in the second embodiment, the second trench penetrating the planar layer PAC is not discussed because it was previously described for the first embodiment. However, if required, the second trench may also be formed in the second embodiment.

The trench TR may have a predetermined depth. The trench TR may include an upper surface US, a lower surface LS, and a side wall SW connected to and linking the upper surface US and the lower surface LS. In forming the lower alignment layer LPI on the second passivation layer PAS2 and the planar layer PAC having the trench TR, the lower alignment layer LPI may not be disposed on the upper surface US of the trench TR. Instead, the lower alignment layer LPI is disposed only on the lower surface LS.

In order to not selectively dispose the lower alignment layer LPI on the upper surface US, embodiments may include that the taper angle (θ°) of the trench TR is at least 50 degrees. That is, the slant angle between the lower surface LS and the side wall SW is at least 50 degrees. Embodiments may include that the taper angle is larger than 55 degree. With these structures, in forming the lower alignment layer LPI on the lower substrate SL, the lower alignment layer LPI may not remain on the upper surface U1 of the trench T1. Most or all of the alignment layer LPI may flow into the trench T1.

Consequently, on some portions of the second passivation layer PAS2 and the planar layer PAC where the trench TR is formed, the lower alignment layer LPI may not be disposed and some upper surfaces of the second passivation layer PAS2 may be exposed. As shown in FIG. 8, by disposing the sealant SEAL with these structures, the sealant SEAL may directly contact with some upper surfaces of the second passivation layer PAS2, especially where the trenches TR are formed. In addition, as the sealant SEAL fills into the inner spaces of the trenches TR, the sealant SEAL may directly contact with the side walls of the trenches TR. Therefore, the narrow bezel structure according to the present disclosure can provide greater attaching and/or joining forces between the upper panel UP and the lower panel LP than the related art.

Hereinafter, with reference to FIGS. 9A to 9D, the method for manufacturing the thin film transistor substrate for the liquid crystal display according to the second embodiment of the present disclosure will be explained. FIGS. 9A to 9D are cross-sectional views illustrating a method for manufacturing the thin film transistor substrate for a fringe field switching type liquid crystal display according to the present disclosure.

Figure 9A:
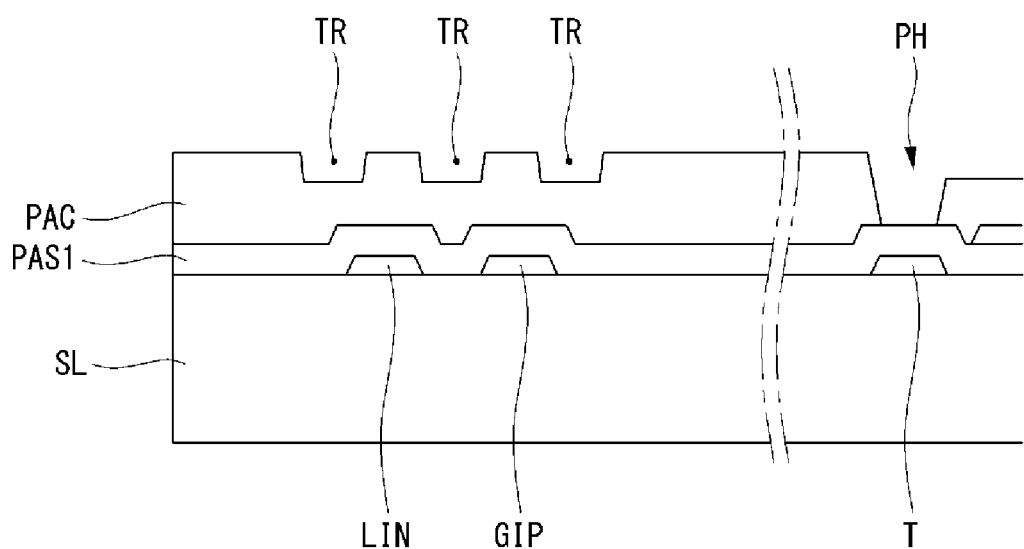
FIGS. 9A to 9D are the cross-sectional views illustrating a method for manufacturing the thin film transistor substrate for a fringe field switching type liquid crystal display according to the present disclosure.

As shown in FIG. 9A, a lower substrate SL for the thin film transistor substrate is prepared. On the lower substrate SL, the thin film transistor T may be formed and the first passivation layer PAS1 may be deposited to cover the thin film transistor T. The color filter CF may be formed within the pixel area on the passivation layer PAS1. The planar layer PAC may be disposed on the lower substrate SL having the color filter CF to cover the whole surface of the lower substrate SL. The pixel contact hole PH may be formed by patterning the planar layer PAC. The trench TR may be formed, having a predetermined depth, at the planar layer PAC covering the gate driver element GIP and the ground line LIN. The depth of the trench TR and the depth of the pixel contact hole PH are different from each other. Therefore, embodiments may use the half-tone mask. Later, by further patterning the first passivation layer PAS1 using the pixel contact hole PH, the pixel contact hole PH may be completed to expose the drain electrode of the thin film transistor T.

Figure 9B:
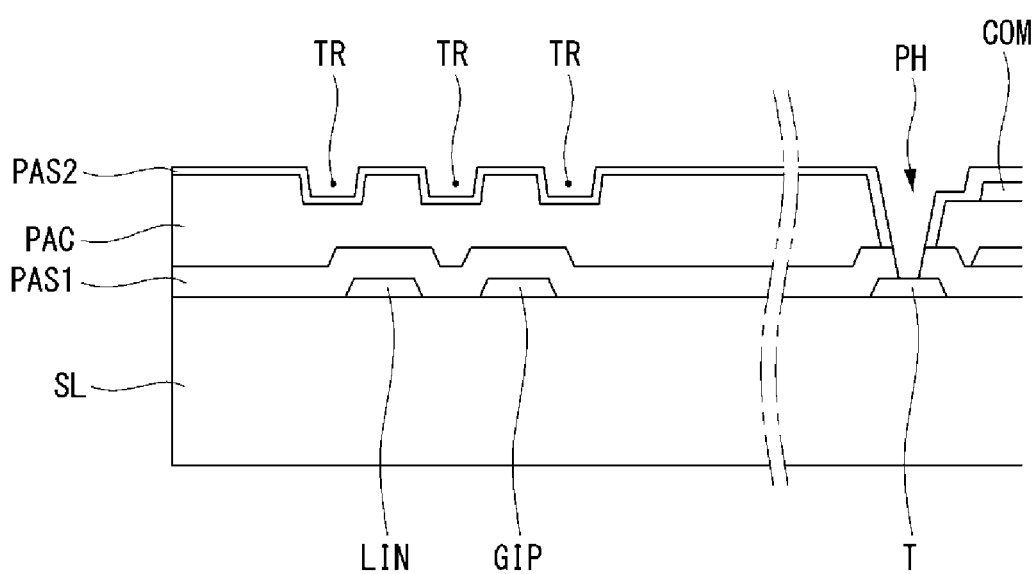
Figure 9C:
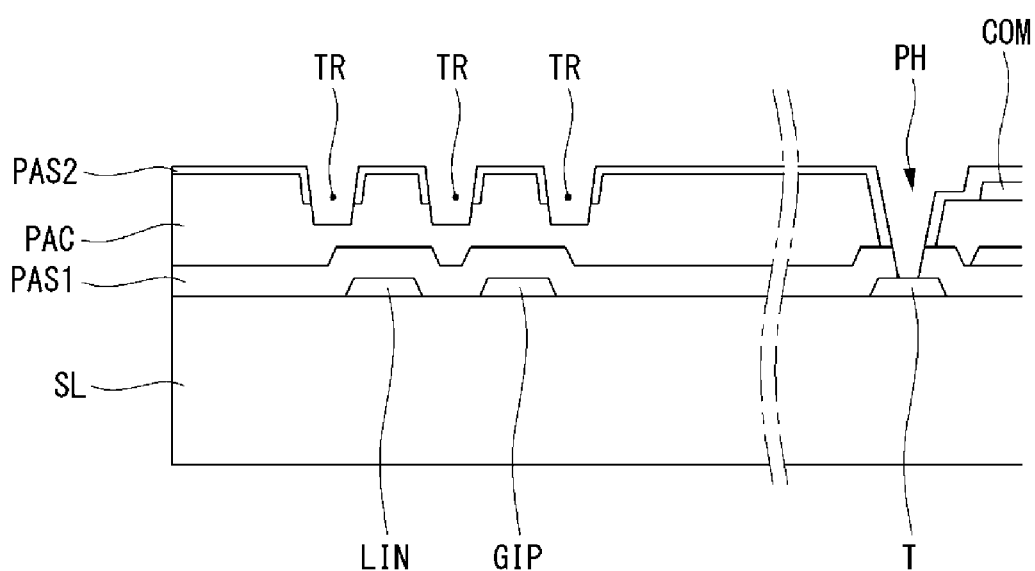

The common electrode COM may be formed on the planar layer PAC having the trench TR and the pixel contact hole PH. The second passivation layer PAS2 may be deposited on the whole surface of the lower substrate SL, as shown in FIG. 9B.

By patterning the second passivation layer PAS2 and the first passivation layer PAS1, the pixel contact hole PH may be completed to expose the drain electrode of the thin film transistor T. Here, by etching the second passivation layer PAS2 and some depth of the planar layer PAC, the trench TR may be completed. The trench TR formed by patterning the planar layer PAC may have a relatively shallow depth, and the taper angle (θ°) of the side wall SW of the trench TR may have a gentle slope because of the half-tone mask. When disposing the lower alignment layer LPI under this structure, the lower alignment layer LPI may remain on the upper surface US of the trench TR. So that the trench TR has sufficient depth and taper angle, the trench TR may also be etched to complete the trench TR during the process of etching the second passivation layer PAS2 for completing the pixel contact hole PH.

Figure 9D:
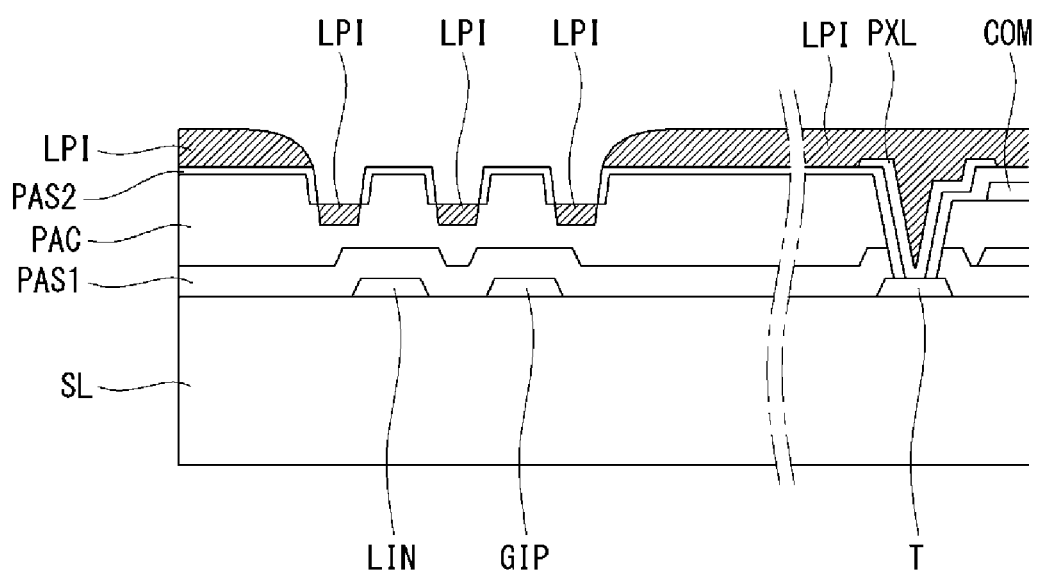

The transparent conductive layer IT may be deposited on the second passivation layer PAS2, and then the pixel electrode PXL may be formed by patterning the transparent conductive layer IT. After that, the lower alignment layer LPI may be disposed on the whole surface of the lower substrate SL having the trench TR and the pixel electrode PXL. As the result, the lower alignment layer LPI may be disposed on the surface of the second passivation layer PAS2. However, the lower alignment layer LPI may not be disposed on the second passivation layer PAS2 where the trenches TR are formed. Instead, the lower alignment layer LPI may flow into the inner space of the trenches TR, as shown in FIG. 9D.

As the lower alignment layer LPI may not be disposed on the area in which the trenches TR1 and TR2 are formed, the sealant SEAL may directly contact the second passivation layer PAS2. Therefore, it is possible to ensure sufficient attaching or joining force of the sealant SEAL. After disposing the sealant SEAL on the surface of the non-display area NA where the trenches TR are formed, and disposing the liquid crystal layer LC within the display area AA, the upper panel UP may be attached on the lower panel LP. As such, the liquid crystal display may be complete.

In the flat panel display in which the alignment layers are disposed as the uppermost layer and two substrates are joined to form the flat panel display according to the present disclosure, the first and the second embodiments provide a joining structure for ensuring the enhanced attaching force between those two substrates. In a case in which the alignment layers are not disposed at the area where the sealant is disposed, sufficient attaching or joining force can be ensured. The area where the sealant is disposed is the bezel area. For the narrow bezel structure, the bezel area may be too narrow, so that it may be impossible to dispose the alignment layer, except for the sealant area.

According to embodiments of the present disclosure, trenches may be formed at the sealant area, so that even though the alignment layers are disposed as covering the bezel area, at least most of the alignment layers may flow into the inner space of the trenches. The alignment layers are partially or selectively not disposed at the trench areas. The sealant can be attached to other layers having better attaching or joining force than the alignment layers. Especially, for the narrow bezel structure, the bezel area includes the gate driver elements and lines, such as a ground line. In that case, it may be preferable that the trenches are formed to not expose or penetrate the passivation layer or planar layer protecting the gate driver elements and lines.

In a case in which the trenches are formed as the passivation layer and/or the planar layer are not penetrated, the taper angle of the side wall of the trench may be less than 30 degrees. In that case, the alignment layers may remain on the upper surface of the trenches. In example embodiments of the present disclosure, the side wall of the trenches may have a taper angle of at least 50 degrees, so that the alignment layers may flow into the trench from the upper surface of the trench.

Further, example embodiments include that the depth of the trench has a predetermined depth such that the alignment layer may effectively flow into the inner space of the trench. There are many possibilities for the predetermined depth of the trenches. In a case in which the second passivation layer is further disposed on the planar layer as in the second embodiment, when the trench is formed at the planar layer and then the second passivation layer is deposited, the taper angle of the side wall of the trenches may be gentle and the depth of the trench may be shallow. In that case, the trench may not work properly. To prevent this problem, some portions of the second passivation layer over the trench may be further etched so that sufficient depth and the taper angle of the trenches can be ensured.

In addition, each trench may be formed over the gate driver elements GIP or the lines, such as the ground line, along the circumference of the substrate. Each trench may have a long half-tunnel shape along the lines. Otherwise, a plurality of short trenches may be disposed along the lines, as the axis of the trenches may be perpendicular to the lines. The cross-sectional shape of each trench may be the well shape having a profile corresponding to any one of circle, ellipse, rectangular, and so on.

In another example embodiment of the present disclosure, the ridge and the furrow pattern may be formed at the insulating layer (e.g., "planar layer" and/or "passivation layer") where the sealant is disposed. In forming the alignment layer on the insulating layer, the alignment material may flow into the furrow portions, such that the alignment material may not be disposed on the ridge portions. Then, disposing the sealant where the ridge and the furrow are formed, the sealant may directly contact the ridge portions where the alignment layer is not disposed and to the side walls of the ridge and the furrow pattern. That is, the sealant may not contact the alignment having a worse adhesive property than other layers, but may contact the insulating layer having a better adhesive properly than the alignment layer. As a result, it may be possible to ensure a superior adhesive property of the sealant to the substrate.

It will be apparent to those skilled in the art that various modifications and variations can be made in the present invention without departing from the spirit or scope of the invention. Thus, it is intended that embodiments of the present invention cover the modifications and variations of this invention provided they come within the scope of the appended claims and their equivalents.

What is claimed is:

1. A flat panel display, comprising:
   an upper panel and a lower panel defining a display area and a non-display area;
   a liquid crystal layer between the upper panel and the lower panel;
   a driver element and a line within the non-display area;
   a planar layer covering the lower panel;
   a first trench at the planar layer over the driver element and the line;
   a lower alignment layer on an upper surface of the planar layer and a lower surface of the first trench, the lower alignment layer exposing a portion of the upper surface of the planar layer at the first trench; and a sealant at the first trench.

2. The flat panel display of claim 1, wherein:

the lower surface of the first trench is sunk down from the upper surface of the planar layer with a predetermined depth smaller than a thickness of the planar layer;

the first trench includes a side wall connected to the lower surface of the first trench; and the sealant contacts:

an exposed portion of the upper surface of the planar layer; and the side wall of the first trench.

3. The flat panel display of claim 2, wherein a taper angle between the side wall and the lower surface is at least 50 degrees.

4. The flat panel display of claim 1, further comprising:

a second trench exposing some of an upper surface of the lower panel at a circumference of the driver element and the line, wherein the lower alignment layer exposes a lower surface of the second trench and some upper surface of the planar layer at the second trench.

5. The flat panel display of claim 4, wherein:

the second trench includes a side wall connected to the lower surface of the second trench; and the sealant directly contacts the exposed upper surface of the planar layer and the side wall.

6. The flat panel display of claim 1, further comprising:

a passivation layer on an upper surface of the planar layer and the side wall of the first trench, wherein the lower alignment layer is disposed on an upper surface of the passivation layer, the lower alignment layer exposing a portion of the upper surface of the passivation layer at the first trench.

7. The flat panel display of claim 6, wherein:

the lower surface of the first trench is sunk down from the upper surface of the planar layer with a predetermined depth smaller than a thickness of the planar layer;

the side wall is connected to the lower surface of the first trench; and the sealant contacts:

an exposed portion of the upper surface of the passivation layer; and the side wall of the first trench.

8. The flat panel display of claim 7, wherein a taper angle between the side wall and the lower surface is at least 50 degrees.

* * * * *